US012477290B2

(12) United States Patent
Grimanis

(10) Patent No.: US 12,477,290 B2
(45) Date of Patent: Nov. 18, 2025

(54) CALIBRATION OF A LOUDSPEAKER SYSTEM

(71) Applicant: Tymphany Worldwide Enterprises Limited, Grand Cayman (KY)

(72) Inventor: Dimitris Grimanis, Taipei (TW)

(73) Assignee: Tymphany Worldwide Enterprises Limited, Grand Cayman (KY)

( * ) Notice: Subject to any disclaimer, the term of this patent is extended or adjusted under 35 U.S.C. 154(b) by 263 days.

(21) Appl. No.: 18/125,835

(22) Filed: Mar. 24, 2023

(65) Prior Publication Data

US 2024/0323626 A1 Sep. 26, 2024

(51) Int. Cl.
*H04R 29/00* (2006.01)
*H03G 5/16* (2006.01)

(52) U.S. Cl.
CPC .......... *H04R 29/001* (2013.01); *H03G 5/165* (2013.01); *H04R 2201/028* (2013.01)

(58) Field of Classification Search
CPC .. H04R 29/001; H04R 2201/028; H04R 3/02; H04R 3/04; H03G 5/165; H04S 7/301
See application file for complete search history.

(56) References Cited

U.S. PATENT DOCUMENTS

| | | | | |
|---|---|---|---|---|
| 6,731,760 | B2 * | 5/2004 | Pedersen | H04R 3/04 381/59 |
| 8,175,284 | B2 * | 5/2012 | Goldberg | H04S 7/301 381/103 |
| 10,728,663 | B2 * | 7/2020 | Ishizuka | H03G 5/025 |
| 2004/0105558 | A1 * | 6/2004 | Montag | H04R 3/04 381/86 |
| 2005/0119879 | A1 * | 6/2005 | Sung | G10L 21/02 704/E21.002 |
| 2012/0057713 | A1 * | 3/2012 | Rabinowitz | H04R 29/001 381/58 |
| 2019/0222932 | A1 * | 7/2019 | Ishizuka | H03H 17/0248 |
| 2019/0320275 | A1 * | 10/2019 | Audfray | H04S 7/301 |
| 2022/0231650 | A1 * | 7/2022 | Goff | H03G 3/3005 |

(Continued)

FOREIGN PATENT DOCUMENTS

| | | | | |
|---|---|---|---|---|
| WO | WO-2004030409 | A2 * | 4/2004 | H04S 1/007 |
| WO | WO-2007028094 | A1 * | 3/2007 | H04R 29/001 |
| WO | WO-2023081534 | A1 * | 5/2023 | G01H 7/00 |

*Primary Examiner* — Akelaw Teshale
(74) *Attorney, Agent, or Firm* — Finnegan, Henderson, Farabow, Garrett & Dunner, LLP

(57) ABSTRACT

The invention relates to a method for calibrating a loudspeaker system in an acoustic environment. The method comprises steps of providing a local frequency response based on a recorded test signal and providing a target frequency response. A difference frequency response is established based on a difference between the local frequency response and the target frequency response. A list of exclusion frequency ranges associated with minima of the local frequency response is generated and one or more filter frequency ranges which are non-overlapping with the exclusion frequency ranges are identified. A target filter frequency is selected from the identified filter frequency ranges and a calibration filter related to the target filter frequency is implemented in an equalizer of the loudspeaker system. The invention further relates to a loudspeaker system arranged to carry out the above method for calibrating a loudspeaker system.

30 Claims, 4 Drawing Sheets

(56) References Cited

U.S. PATENT DOCUMENTS

Figure 1:
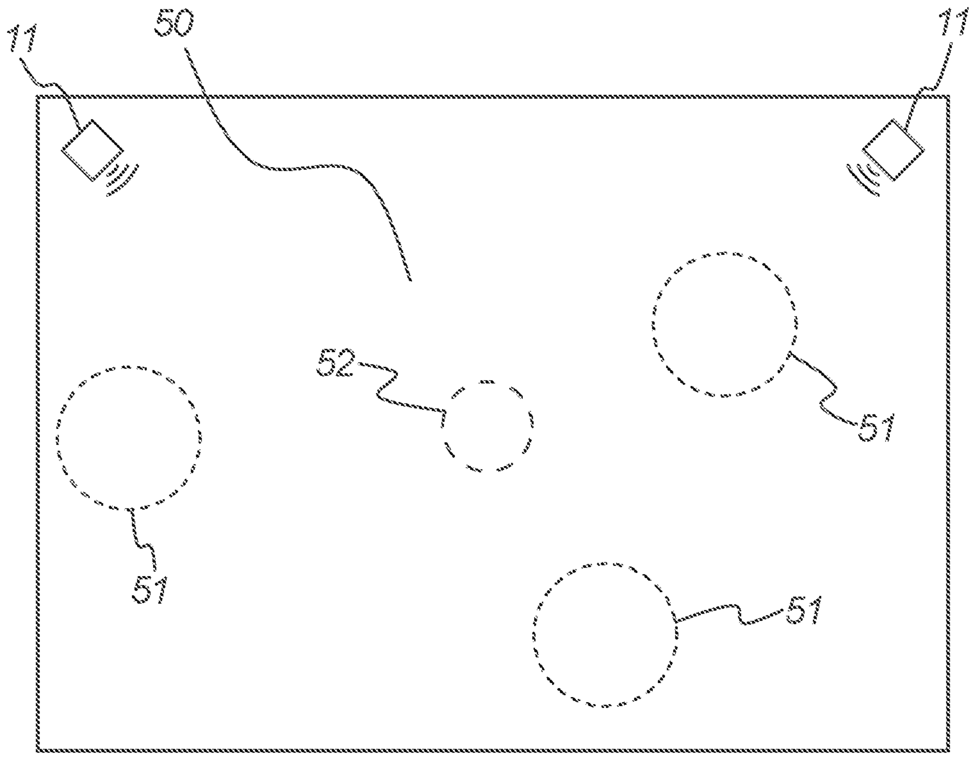

| | | | | |
|---|---|---|---|---|
| 2023/0079741 | A1* | 3/2023 | Snook .................... | H04R 1/403<br>381/59 |
| 2023/0146772 | A1* | 5/2023 | Snook .................. | H04R 29/007<br>381/303 |

* cited by examiner

CALIBRATION OF A LOUDSPEAKER SYSTEM

FIELD OF THE INVENTION

The present invention relates to a method of calibrating a loudspeaker system. The present invention further relates to a loudspeaker system.

BACKGROUND OF THE INVENTION

Loudspeaker systems are used in a variety of different acoustic setups, ranging from small loudspeaker systems such as a stereo in a living room and to larger systems for use in big venues such as concerts.

The frequency response of a loudspeaker inside a room is typically influenced by a number of undesired interference effects, such as constructive and destructive interference effects. Compensation of such interferences may be performed by equalizing the frequency response using filters, however for some types of interferences application of filters may not be particularly suitable and could in worst case scenario lead to overdriving of loudspeakers of the loudspeaker system.

SUMMARY OF THE INVENTION

The inventors of the present invention have realized the above-mentioned challenge related to compensation of interference effects and provides the below method of calibrating a loudspeaker system to obtain a desired frequency response without risking overdriving any loudspeakers of the loudspeaker system.

An aspect of the invention relates to a method for calibrating a loudspeaker system in an acoustic environment;

wherein said loudspeaker system comprises at least one loudspeaker, an audio amplifier, an equalizer, and an audio signal processor;

wherein the method comprises the steps of:

applying an audio test signal to said loudspeaker system to generate an audio test sound in said acoustic environment, recording said audio test sound at a listening position in said acoustic environment to obtain a recorded test signal, and providing a local frequency response based on said recorded test signal;

providing a target frequency response for said at least one loudspeaker in said acoustic environment;

establishing a difference frequency response based on a difference between said target frequency response and said local frequency response;

generating on the basis of an exclusion criterium a list of exclusion frequency ranges associated with minima of said local frequency response;

identifying one or more filter frequency ranges associated with minima and/or maxima of said difference frequency response, wherein said filter frequency ranges are non-overlapping with said exclusion frequency ranges;

selecting a target filter frequency selected from said identified filter frequency ranges; and implementing in said equalizer a calibration filter related to said target filter frequency to provide a filtered frequency response, wherein said calibration filter is arranged to reduce a difference between said filtered frequency response and said target frequency response.

A loudspeaker is a device arranged to convert an audio signal into sound in the form of acoustic waves i.e. sound waves. Typically, a loudspeaker comprises a loudspeaker diaphragm which reciprocates according to the audio signal to create pressure waves of air, i.e. sound waves.

The intensity of a sound wave may be quantified by the sound pressure level. The sound pressure level may be measured and expressed in units of decibel relative to a reference level.

As an example, sound pressure level $L_p$ (in units of dB) of a sound wave may be calculated using the following equation, where p is the sound pressure of the sound wave and $p_0$ is the reference sound pressure:

$$Lp = 20\log_{10}\left(\frac{p}{p_0}\right)\text{ dB}$$

An often-used reference level for sound is the threshold of perception of an average human, i.e. the lowest sound pressure possible to hear by a human. As an example, the reference sound pressure may be of the order of 20 micropascal.

When comparing two sound pressure levels of two different sound waves, the difference between the two sound pressure levels may also be referred to as a sound pressure level.

By a loudspeaker system is understood a system comprising one or more loudspeakers such as comprising a single loudspeaker working as a stand-alone device or such as two loudspeakers working in association to provide for stereo reproduction of an audio signal. The loudspeaker system may further comprise one or more loudspeaker driving units such as amplifiers which provides an amplified audio signal to the one or more loudspeakers. A loudspeaker which receives an amplified audio signal from an external driving unit may also be referred to as a passive loudspeaker.

In an embodiment of the invention the loudspeaker system comprises at least one loudspeaker driving unit, such as at least one amplifier, which is are separate device to the one or more loudspeakers of the loudspeaker system. In an alternative embodiment of the invention, the one or more loudspeakers of the loudspeaker system comprises one or more loudspeaker driving units such as one or more amplifiers. A loudspeaker comprising its own driving unit(s) may also be referred to as an active loudspeaker.

An audio amplifier may also be understood as an audio power amplifier. The audio amplifier is arranged to amplify an electronic audio signal. Typically, an audio signal supplied to a loudspeaker is an audio signal which has been amplified by an audio amplifier. As such, a loudspeaker system typically comprises an audio amplifier.

The loudspeaker system may comprise an equalizer. By an equalizer may be understood a device arranged to adjust a balance between frequency components of an electronic signal. An equalizer may thus be used to amplify and/or attenuate separate frequency bands or frequency ranges. Some types of equalizers work by implementing frequency filters, e.g. calibration filters, at separate filter frequencies. The equalizer may be a separate device of the loudspeaker system or it may be implemented, such as software implemented, as a module in other components of the loudspeaker system. The equalizer may be a parametric equalizer, i.e. a multi-band variable equalizer.

The loudspeaker system may comprise an audio signal processor. By an audio signal processor may be understood a device arranged to process an audio signal in either a digital or an analogue format, and the processing may occur in any domain, such as in time domain or frequency domain. An audio signal processor may thus be capable of e.g. generating a representation of frequency composition of an audio signal. The audio signal processor may further comprise said equalizer, for example, the equalizer may be an audio processing module of the audio signal processor, such as a software implemented audio processing module.

An acoustical environment may be understood as any environment which influence the propagation of acoustic sound from the loudspeaker system, e.g. a room, a hall or even an open music concert area in front of a stage. Particularly, a room may exhibit a strong influence of acoustic sound to be listened to by a person in that room. The sound waves may be reflected by e.g. walls and obstacles in the room and thereby create sound wave interference within the room. Interference of waves may be understood as a phenomenon of waves in which multiple waves superpose to generate constructive interference and/or destructive interference. In regions of constructive interference, waves add up such that the combined amplitude is larger than the amplitude of a single wave. For example, if a crest of a sound wave meets a crest of another sound wave of the same frequency at the same point, then the amplitude is the sum of the individual amplitudes. On the contrary, in destructive interference, a crest of a sound wave may meet a trough of another sound wave of the same frequency, and then the amplitude is equal to the difference in the individual amplitudes. Furthermore, when a plurality of speakers produces concurrent sound waves, interference may also occur as a result of interfering sound waves from different loudspeakers. The interferences of waves influencing the acoustic sound reproduction in a room may also include so-called room modes, i.e. frequencies at which standing waves are likely to occur due the physical dimensions in the room, e.g. distance between hard walls, and which produce spatially fixed nodes and antinodes where the sound is perceived as particularly attenuated or intensified.

An interference pattern from a speaker system is typically dependent on the frequency of the emitted sound wave. As such, one frequency may have one interference pattern, whereas another frequency has another frequency pattern. At a given position within the room, a given frequency of sound from a loudspeaker system may thus interfere constructively, and another frequency of sound may interfere destructively.

Interference effects in an acoustic environment, such as a room, are typically most prominent at frequencies corresponding to wavelengths which are comparable in size to characteristic dimensions of the acoustic environment, such as the size of the room, e.g. spacings between walls. Such prominent frequencies may be in the range from 20 Hz to 150 Hz, but in principle, interference effects are not restricted to any specific range of frequencies.

An aim of a loudspeaker system is to reproduce the audio signal in such a way that the generated acoustic sound is perceived by a listener as intended, i.e. the generated acoustic sound resembles the audio signal as much as possible. However, at specific positions within the acoustic environment, such as at specific listening positions within the acoustic environments, interference effects may distort the sound emitted by the loudspeaker system. The influence of the interference effects on the reproduction of the audio signal may be described by a frequency response. A frequency response may thus describe a change in sound pressure level, i.e. a gain, across a range of frequencies, e.g. due to the acoustic environment. An example of an ideal frequency response may be a frequency response characterized by a gain of 0 dB across the entire frequency range, i.e. a flat frequency response, however, most acoustic environments are prone to interference effects as mentioned above, and therefore the frequency response of the acoustic environment may deviate from this ideal frequency response. For example, in a room, an audio test signal may be applied to a loudspeaker system to generate an audio test sound. At a position within the room, such as a listening position, a recording of the audio test sound may be performed to provide a recorded test signal. The frequency composition of the recorded test signal will most likely differ from the frequency composition of the audio test signal, i.e. some frequencies in the recorded test signal may be less or more pronounced than the corresponding frequencies in the audio test signal.

A local frequency response may be obtained on the basis of a difference between the recorded test signal and the audio test signal. The composition or shape of the local frequency response may be highly influenced by interference effects. A sound pressure level maximum of the local frequency response may e.g. be due to constructive interference at the frequency of the sound pressure level maximum, and a sound pressure level minimum of the local frequency response may e.g. be due to destructive interference at the frequency of the sound pressure level minimum. The local frequency response may thus be understood as a representation of the influence of interference effects on sound from a loudspeaker system at a particular position within an acoustic environment.

For a person listening to sound from a loudspeaker system, interference effects due to the acoustic environment may be perceived as a distortion of the desired sound. Such a distortion may be corrected by implementation of one or more calibration filters. For example, if a local frequency response comprises a sound pressure level maximum, a calibration filter may be implemented in an equalizer such that an audio signal applied to the loudspeaker system is attenuated at frequencies of the audio signal at the sound pressure level maximum of the local frequency response. And similarly, if a local frequency response comprises a sound pressure level minimum, a calibration filter may be implemented in the equalizer such that an audio signal applied to the loudspeaker system is amplified at frequencies of the audio signal at the sound pressure level maximum of the local frequency response.

An acoustic environment may provide one or more particularly prominent destructive interference effects at particular frequencies. Such a destructive interference may be referred to as an acoustic null as used in the following. An acoustic null may for example, be characterized by a sound pressure level which is reduced by 9 dB compared to an average sound pressure level of a local frequency response.

Generally, a purpose of an equalizer is to alter the frequency response of a loudspeaker system using one or more filters. An equalizer may e.g. be used to smooth out the frequency response of a loudspeaker system by applying filters, such as first order filters and second order filters to an audio signal, whereby peaks and/or dips in the local frequency response are compensated or corrected. However, there may be problems relating to such corrections, and these are problems relating in particular to the abovementioned acoustic nulls. An implementation of a filter which amplifies frequencies of an audio signal at an acoustic null may require excessively large amounts of energy to amplify which may simply not be reproducible by the amplifier or may result in damages to the loudspeaker system due to overdriving of the one or more loudspeakers. Alternatively, an equalizer may be arranged to ignore minima of the local frequency response, to circumvent the above problem of overdrive, while only implementing one or more filters to correct maxima in the local frequency response.

The present invention relates to a method for performing a calibration of a loudspeaker system by implementation of one or more filters to correct a local frequency response. According to embodiments of the invention, the method may be programmed into a loudspeaker system and one or more steps of the method may be controlled at least partly using external inputs from a controlling device such as a smartphone, computer or tablet.

The method of the invention is briefly summarized in this paragraph and is subsequently described in more detail. The method relies on measuring a local frequency response within an acoustic environment, which may be compared to a target frequency response to generate a difference frequency response. These frequency responses are analysed to generate a list of exclusion frequency ranges, which are frequency ranges in which acoustic nulls are expected to be present. Then, remaining frequency ranges are analysed to identify a target filter frequency, i.e. a frequency at which a filter may be implemented. When the filter is implemented, a filtered frequency response is provided, which may be calculated based on the local frequency response in combination with the parameters of the implemented filter. Typically, the parameters of the implemented calibration filter may be selected to reduce a difference between the filtered frequency response and the target filter frequency. After the implementation of a filter, the procedure may be repeated to implement any number of filters, such that the difference between the filtered frequency response and the target frequency response is reduced further, while taking acoustic nulls into account through exclusion frequency ranges.

The method of the invention is now outlined in more detail.

In a preferred embodiment of the invention, a local frequency response is generated by applying an audio test signal to said loudspeaker system to generate an audio test sound, which is recorded at a listening position such that a recorded test signal is provided. The listening position may be any position within the acoustic environment where a correction of the local frequency response is desired. Based on the recorded test signal and the audio test sound, a local frequency response may be generated, e.g. based on a ratio or a difference of the recorded test signal and the audio test signal. According to an embodiment of the invention, the step of providing a local frequency response may comprise performing a plurality of recordings of an audio test sound at a corresponding plurality of listening positions. The local frequency response may be provided based on averaging of sound pressure levels of the plurality of recordings.

The method further comprises a step of providing a target frequency response for said at least one loudspeaker in said acoustic environment. The target frequency response may be understood as a frequency response which is desired by a listener to the loudspeaker system at a specific location within the acoustic environment, i.e. at a listening position within the acoustic environment. As an example, the target frequency response may be a flat frequency response, or a non-flat frequency response based on e.g. preferences of the listener to the loudspeaker system and/or a genre or type of audio content to be reproduced by the loudspeaker system. As an example, a desired frequency response may be biased towards amplification of low-frequency sounds for playback of some genres of music such as rap or hip-hop. Alternatively, the desired frequency response, i.e. target frequency response, may be biased towards amplification of mid-range frequencies, such as frequencies in the range from 300 Hz to 3 kHz, for playback of audio comprising primarily human voices which is primarily present in e.g. radio- or tele broadcasts.

According to an embodiment of the invention the target frequency response is pre-programmed into the loudspeaker system or supplied externally to the loudspeaker system from a controlling device such as a smartphone, computer or tablet. As an example, a user of or a listener to the loudspeaker system may configure a desired frequency response on the controlling device and supply the desired frequency response to the loudspeaker system as a provided target frequency response. Alternatively, the user or listener may select an already pre-programmed frequency response using the controlling device, such as by inputting a selection of a pre-programmed frequency response from a list of pre-programmed frequency responses. After selection or configuration of the desired frequency response, the desired frequency response is transmitted, e.g. wirelessly, to the loudspeaker system and used by the loudspeaker system as a target frequency response.

According to an embodiment of the invention the target frequency response may be determined on the basis of the local frequency response, however the target frequency response may be different from the local frequency response. As an example, the target frequency response may represent a flat frequency response which is based on an average of the sound pressure level of the local frequency response.

Based on a difference between the target frequency response and the local frequency response, a difference frequency response is generated. The difference frequency response may be generated by subtraction of the local frequency response from the target frequency response or alternatively (depending on a specific implementation of the method) a subtraction of the target frequency response from the local frequency response. In this sense the difference frequency response may be regarded as a representation of a difference between a measured frequency response and a desired frequency response, i.e. a target frequency response.

If the local frequency response is identical to the target frequency response the difference frequency response is represented by a flat frequency response at 0 dB, indicative of no difference between the local frequency response and the target frequency response. However, a difference frequency response may typically present a number of differences between the two owing to interference effects in the acoustic environment, and these differences may be represented by a number of minima/dips below 0 dB and/or maxima/peaks above 0 dB in the difference frequency response. As an example, a minimum of −10 dB at a specific frequency in the difference frequency response may indicate that at this specific frequency the local frequency response has a sound pressure level which is 10 dB below the sound pressure level in the target frequency response. According to embodiments of the invention, a minimum which is below −9 dB in the difference frequency response is referred to as an acoustic null.

The method is based on a use of an exclusion criterium. The exclusion criterium is used to determine whether a frequency region of the difference frequency response may be considered as a frequency region comprising an acoustic null. In a preferred embodiment, the exclusion criterium is a sound pressure level threshold. This threshold is used to exclude frequency ranges containing certain minima/dips of the difference frequency response from further processing.

According to an embodiment of the invention, the sound pressure level threshold is in the range from −20 dB to −2 dB, such as in the range from −15 dB to −5 dB, for example −9 dB. A frequency range of the difference frequency response comprising a minimum/dip having a sound pressure level negatively exceeding −9 dB is added to a list of exclusion frequency ranges. Frequency ranges appearing on this list may according to embodiments of the invention not be used in implementation of filters.

The extent/width of such an exclusion frequency range may for example be determined by zero-crossings of the sound pressure level of the difference frequency response. By a zero-crossing is understood a frequency at which the sound pressure level is approximately 0 dB. For example, an exclusion frequency range may extend from a first frequency at which the sound pressure level of the difference frequency response is approximately 0 dB to a second frequency at which the sound pressure level of the difference frequency response is approximately 0 dB, not including additional zero crossings, while comprising a sound pressure level minimum below a sound pressure level threshold, such as below −9 dB. Other ways of delimiting the exclusion frequency ranges may be applied, e.g. by fixed frequency bands, by steep slopes, by user defined ranges, etc.

The method further comprises identifying one or more filter frequency ranges. In a preferred embodiment of the invention, the method comprises sorting all frequency ranges between neighbouring zero crossings of the sound pressure level of the difference frequency response into filter frequency ranges and exclusion frequency ranges, such that any frequency range associated with a sound pressure level of the difference frequency response below a sound pressure level threshold is added to a list of exclusion frequency ranges, while the remaining frequency ranges are added to a list of filter frequency ranges. The frequency ranges appearing on the list of filter frequency ranges represents frequency ranges which application of filters may be based upon. The steps of identifying filter frequency ranges and exclusion frequency ranges may preferably be performed within a pre-defined frequency interval, e.g. the typical audio range of 20 Hz to 20 kHz, or a narrower range of particular interest, e.g. to improve speech intelligibility in the range of 300 Hz to 3 kHz, or e.g. a range where the benefits of the calibration are particularly pronounced, e.g. from 10 Hz to 300 Hz, such as from 20 Hz to 200 Hz, for example within a pre-defined frequency interval from 20 Hz to 150 Hz. The lower and upper limit to these frequency intervals may be referred to calibration method frequency limits.

The next step of the method according to the present invention is to select a target filter frequency at which a calibration filter is to be implemented in the equalizer. A calibration may also be referred to as a parametric equalizer filter. A calibration filter may preferably be a digital biquad filter, but is not necessarily limited to this example, and other types of filters known to a skilled person may also be implemented. A digital biquad filter may be understood as a type of second order recursive linear filter, which has a transfer function in a frequency domain that is a ratio of two quadratic functions. A digital biquad filter is a type of infinite impulse response filter. It is typically characterized by parameters which may be a gain, a filter frequency, and a filter quality factor. The gain may describe the change in sound pressure level that the filter exerts at the filter frequency. A gain may either be positive, e.g. 5 dB, or negative, e.g. −5 dB, and a calibration filter may thus be used to either amplify or attenuate a range of frequencies, such as a filter frequency range. The filter quality factor may describe the width of the interval of frequencies around filter frequency which are affected by the implementation of the filter. One calibration filter may thus be narrow and only affect a relatively narrow range of frequencies, whereas another calibration filter may be broad and affect a relatively broad range of frequencies, which is parametrized by the filter quality factor. The filter quality factor is thus related to the bandwidth of the filter.

The target filter frequency is selected from within an identified filter frequency range. In a preferred embodiment, a target filter frequency is selected based on sound pressure level, e.g. the frequency within the filter frequency ranges at which the largest absolute sound pressure level of the difference frequency response is present is selected as a target filter frequency. In other embodiments, selecting a target filter frequency may rely on an integration of the sound level pressure within the different filter frequency ranges, e.g. a target filter frequency is selected from the filter frequency range which has the largest absolute integrated sound pressure level.

According to the present invention, the calibration filter may then be implemented at the target filter frequency, i.e. the filter frequency of the calibration filter may be the target filter frequency.

The implementation of a calibration filter provides for a filtered frequency response. The filtered frequency response is thus the resulting frequency response after implementation of one or more filters. The parameters of the implemented filters are selected to reduce a difference between the filtered frequency response and the target frequency response. For example, in some preferred embodiments, the gain is selected such that the filtered frequency response is approximately equal to the target frequency response at the filter frequency.

In an embodiment of the invention, the filter quality factor is chosen such that the difference between the filtered frequency response and the target frequency response is minimized within the filter frequency range associated with the target filter frequency. This selection may be performed on the basis of a fitting procedure. In other embodiments of the invention, a filter quality factor may be selected on the basis of an integrated sound pressure level within the filter frequency range associated with the target filter frequency. In yet further embodiments of the invention, a filter quality factor may be selected on the basis of a full width at half maximum (FWHM) of the difference frequency response at the target filter frequency. Selecting the filter quality factor on the basis of a full width at half maximum value of the difference frequency response at the target filter frequency may be advantageous in that the FWHM-value is a representative measure of the width of the peak/dip at the target filter frequency and thus a suitable measure for determining the width of the filter to be applied, i.e. the filter quality factor.

When filter parameters are selected, the filter may be implemented in the equalizer of the loudspeaker system. The loudspeaker system may then be ready to receive an input audio signal which may be filtered by the implemented calibration filter to provide a filtered audio signal. The filtered audio signal may then be emitted as sound by the loudspeaker system, and within regions of the acoustic environments, the sound may be less distorted than if a filter had not been implemented.

Instead of just implementing one filter according to the present method of the invention, any steps relating to the implementation of a filter may be repeated any number of times to implement any number of filters. There are in principle no restrictions, as to which steps of the method which need to be repeated. For example, in some embodiments, after obtaining a filtered frequency response, this filtered frequency response may be utilized as a new difference frequency response and based on this new difference frequency response a new target filter frequency is selected, at which a new filter may be implemented. In some of these embodiments, the list of exclusion frequency ranges may be updated after the implementation of a calibration filter, whereas in other embodiments, the list of exclusion frequency ranges is not updated.

Embodiments of the invention may comprise implementation of any number of filters, for example between 5 and 20 filters, or even more filters such as between 5 and 100 filters, for example 25 filters or 75 filters. The number of filters which may be applied depends on the number of available bands in the equalizer and the audio signal to be filtered. Each time a filter is implemented, the filtered frequency response may further approach the target filter frequency, while acoustic nulls are specifically not taken into account, since these are associated with exclusion frequency ranges. Ideally, the method according to the invention may then be able to compensate for e.g. interference effects in an acoustic environment, while not damaging a loudspeaker, e.g. overdriving a loudspeaker, or wasting energy due to a large pressure compensation at the frequency of an acoustic null.

According to the invention, a method is provided for calibrating a loudspeaker system in an acoustic environment. By performing a calibration according to the present invention is realized a frequency response of the acoustic environment which may become as close as possible to a desired target frequency response. Furthermore, by excluding specific frequency ranges comprising minima having sound pressure levels below a threshold sound pressure level, is avoided that filters are applied to attempt to compensate these minima. This is particularly advantageous, since these minima, or acoustic nulls, may be difficult to compensate without overdriving the loudspeaker of the loudspeaker system, and/or the energy used for unsuccessful attempted compensation would just be wasted. Thus, is achieved a method of compensating for interference effects while protecting the loudspeaker(s) of the loudspeaker system from overdriving. A further effect is that power consumption of the loudspeaker system may be reduced since no electrical energy is wasted in attempts to compensate for acoustic nulls which cannot be reasonably compensated anyway.

According to an embodiment of the invention said step of recording said audio test sound at a listening position in said acoustic environment comprises recording said audio test sound using an electronic processing device comprising a microphone.

By an electronic processing device comprising a microphone is understood any electronic device arranged to record acoustic sound, such as an audio test signal, and perform any type of signal processing to the recorded acoustic sound, such as the recorded audio test signal. The electronic processing device may be a smartphone, a tablet, a laptop, or any other suitable handheld electronic device comprising a microphone and a processor. In an embodiment of the invention, said electronic processing device comprises said audio signal processor.

According to an embodiment of the invention said target frequency response is based on said local frequency response.

According to an embodiment of the invention said target frequency response is an average of said local frequency response.

The target frequency response may be provided on the basis of the local frequency response. As an example, the target frequency response in a frequency interval may be the average sound pressure level of the local frequency response in that frequency interval, such that the target frequency response is a constant independent of frequencies within the frequency interval.

According to an embodiment of the invention said target frequency response is based on a predetermined frequency response.

The target frequency response may be based on a predetermined frequency response which is stored in a memory communicatively associated with the audio signal processor.

Embodiments of the invention may have several stored predetermined frequency responses. This may for example be for different calibration purposes, for example for different types of acoustic environments, for example a kitchen, a living room, a hall or a bathroom. Alternatively, it may be for different types of calibration, for examples calibrations which focuses on certain frequency intervals, for example calibrations which may improve bass frequencies, midrange frequencies, or treble frequencies.

According to an embodiment of the invention said target frequency response is defined by a user of said loudspeaker system.

In some embodiments of the invention, a user may define the target frequency response, e.g. directly via the speaker system or through a device such as a smartphone, computer or tablet. It may be advantageous, to allow the user to tailor the target frequency response to ensure an adaptive calibration method with a high degree of control.

The target frequency response may not be a constant across the frequency interval. For example, it may be determined based on a calculation of the average sound pressure level of the local frequency response in combination with a pre-programmed frequency response. In other words, the target frequency response may represent a pre-programmed frequency response which is modulated by the calculated average of the sound pressure level of the local frequency response. A pre-programmed frequency response, e.g. a pre-set equalizer setting, may comprise any equalizer setting selected from the following; Acoustic, Bass Booster, Bass Reducer, Classical, Dance, Electronic, Hip-Hop, Jazz, Piano, Pop, R&B, Rock and Vocal Booster. The above list of equalizer settings is non-exhaustive and other settings suiting other types of audio content may be envisioned.

In an embodiment of the invention, the target frequency response is provided by first applying a pre-set equalizer setting, characterized by its own pre-programmed frequency response, and next modulating that frequency response on the basis of the local frequency response. As an example, the pre-programmed frequency response may be shifted in sound pressure level according to an average sound pressure level of the local frequency response. In another embodiment of the invention a preliminary target frequency response is generated on the basis of the local frequency response, such as an average value of the local frequency response. This preliminary target frequency response is next modulated by the pre-programmed frequency response, such as the ones explained in the above list of pre-set equalizer settings. In a further embodiment of the invention, the step of providing a target frequency response is performed in a combined calculation step wherein both a local frequency response and a pre-programmed frequency response is taken into consideration.

It may be advantageous to determine the average sound pressure level of a target frequency response on the basis of the average sound pressure level of a local frequency response. The average sound pressure level of a local frequency response in a large room, may be different from the average sound level pressure level of a local frequency response in a small room. To account for such differences the local frequency response and/or target frequency response may be adjusted in terms of absolute level such that a subtraction of one response from the other response results in a meaningful difference frequency response.

According to an embodiment of the invention said target frequency response is based on a recording of an auxiliary audio test sound.

By an auxiliary audio test sound may be understood any acoustic sound produced by the loudspeaker system.

The recording may take place at any recording position within the acoustic environment. The recording may be used to provide a recording position frequency response. The recording positions may e.g. be in front of at least one loudspeaker, or far away from the at least one loudspeaker, e.g. at any location within the acoustic environment. In an embodiment of the invention a plurality of recordings is performed at a plurality of recording positions within the acoustic environment.

The target frequency response may be based on an averaging of sound pressure levels of recordings of said auxiliary audio test sound. For a single recording, the target frequency response may be based on an average of sound pressure level of the single recording. For more than one recording of the auxiliary audio test sound the target frequency response may be based on a plurality of averages of sound pressure level; each average sound pressure level being associated with a distinctive recording of said auxiliary audio test sound at a distinctive recording position.

Based on recordings of an audio test sound, the target frequency response may be generated. The local frequency response may further be used in the generation of the target frequency response, e.g. to match the average sound level pressure of the target frequency response to the sound pressure levels of the local frequency response.

According to an embodiment of the invention the recording of an auxiliary audio test sound recording is a proximity measurement. Thus, the target frequency response may be obtained by doing a proximity measurement, i.e. a measurement in close proximity to the at least one loudspeaker. A proximity measurement may be performed by placing the loudspeaker far from acoustic obstacles of the acoustic environment, e.g. walls of a room, and placing the microphone in close proximity to the loudspeaker, or specifically in close proximity to a woofer of the loudspeaker. By close proximity may be understood a separation distance from 0 centimetres to 50 centimetres, such as from 1 centimetre to 30 centimetres, such as from 5 centimetres to 20 centimetres, for example from 5 centimetres to 15 centimetres. In this way, the direct sound wave coming out of the loudspeaker, e.g. woofer of the loudspeaker, is always much greater in sound pressure level than sound waves that come to the microphone from reflections in the acoustic environment, e.g. reflections from walls in a room. The recording obtained in this manner is thus representative of an anechoic measurement of the loudspeaker. This proximity measurement may thus directly serve as the target frequency response. Furthermore, the auxiliary audio test sound may be the audio test sound.

A target frequency response based on at least one recording of an auxiliary audio test sound in front of a loudspeaker may be advantageous since it may, to some degree, isolate a frequency response of a loudspeaker. A target frequency response may then include a frequency response of a loudspeaker, and consequently the method will primarily perform the calibration to correct for distortions of the acoustic environment, not for distortions of the loudspeaker.

According to embodiments of the invention, a proximity measurement is performed to generate a preliminary target frequency response. Next, a local frequency response is provided and an offset between the preliminary target frequency response and the local frequency response is determined. Finally, the target frequency response is generated based on the predetermined frequency response and the offset. Hereby is accomplished that the local frequency response and target frequency response are at similar general sound pressure levels and thus a meaningful difference frequency response may be obtained through subtractions between the two.

According to an embodiment of the invention said target frequency response is based on a plurality of recordings of said auxiliary audio test sound.

The target frequency response may be based on a plurality of recordings of an auxiliary audio test sound produced by the loudspeaker system. The plurality of recordings may be performed at a plurality of recording positions within said acoustic environment. A purpose of performing a plurality of recordings of an auxiliary test sound may be to establish a general impression of the acoustics of the acoustic environment. For example, an acoustic environment may comprise one or more acoustic nulls, and by recording an auxiliary audio test sound in a plurality of recording positions within said acoustic environment it may be prevented that a target frequency response is established on the basis of an acoustic null, whereby the target frequency response would include sound pressure levels that are too low. By recording in multiple recording positions, distinct variations in the frequency response of the acoustic environment, due to e.g. acoustic nulls, may thus be effectively smoothed out. The recordings of the auxiliary audio test sound may be performed by said electronic processing device comprising a microphone. Thus, a user of the loudspeaker system may both perform recordings of an auxiliary audio test sound and/or a recording of an audio test sound using the electronic processing device during calibration of the loudspeaker system. This recording procedure may require the user to position him/her at various recording positions within the acoustic environment. It may further be advantageous to generate the target frequency response based on multiple recordings, recorded at various recording positions within the acoustic environment, since this may reduce the effect of noisy measurements, e.g. measurements where other sound from unwanted sound sources are present.

The target frequency response may also be provided by combination of a pre-programmed/determined frequency response, as described above, and one or more recordings of an auxiliary audio test sound, such as a plurality of recordings of an auxiliary audio test sound. In this sense, a pre-programmed frequency response may effectively be modulated in sound pressure level by using recordings of a test sound recorded at one or more recording positions within the acoustic environment, i.e. the pre-programmed frequency response is modulated to the acoustics of the specific acoustic environment.

According to an embodiment of the invention said auxiliary audio test sound is said audio test sound.

The auxiliary audio test sound and the audio test sound may be the same sound. This may improve the quality of the difference frequency response, based on the difference between the local frequency response and the target frequency response.

According to an embodiment of the invention said exclusion criterium comprises a sound pressure level threshold.

The method according to the invention relies on generating a list of exclusion frequency ranges based on an exclusion criterion. The list of exclusion frequency ranges should preferably comprise frequency ranges in which acoustic nulls are present. The exclusion criterium determines whether a frequency range is added to the list of exclusion frequency ranges. Using a sound pressure level threshold as an exclusion criterium is advantageous in that frequency ranges may be excluded from filtering depending on a sound pressure level of the difference frequency response within the frequency range. Thereby it may be possible to exclude frequency ranges comprising an acoustic null from filtering.

According to an embodiment of the invention a frequency range associated with a minimum of said local frequency response is assigned to said list of exclusion frequency ranges when an absolute value of a sound pressure level of said difference frequency response exceeds said sound pressure level threshold within said frequency range.

By identifying sound pressure level minimum/dip in the difference frequency response and comparing these with the sound pressure level threshold it may be determined whether a frequency range associated with that minimum should be excluded from filtering, e.g. excluded from implementation of a calibration filter at a frequency in close proximity to or equal to a central frequency of that minimum. Thereby is ensured that a calibration filter is not implemented at a frequency corresponding to a frequency for which there is an acoustic null at the listening position within the acoustic environment.

According to an embodiment of the invention said sound pressure level threshold is a threshold value in the range from 2 dB to 20 dB, such as in the range from 5 dB to 15 dB, for example 9 dB.

An acoustic null is associated with a minimum in the local frequency response, however, since a plurality of minima which are not associated with an acoustic null are present, there must be a way of distinguishing an ordinary minimum from an acoustic null minimum. This step of distinguishing between the two types of minima may be done by comparing a sound pressure level of the minimum in the difference frequency response with the sound pressure level threshold. As an example, if a sound pressure level threshold is set at 9 dB, this means that if a minimum of the difference frequency response exceeds a value of negative 9 dB, i.e. −9 dB, then that minimum is treated as an acoustic null, and the frequency range associated with that minimum is added to the list of exclusion frequency ranges.

According to an embodiment of the invention a frequency range associated with a minimum of said local frequency response is assigned to said list of exclusion frequency ranges when a frequency width associated with said minimum exceeds a frequency width threshold.

According to an embodiment of the invention a frequency range associated with a minimum of said local frequency response is assigned to said list of exclusion frequency ranges when an integrated sounds pressure level associated with said minimum exceeds an integrated sounds pressure level threshold.

It is not only the extremum value of the sound level pressure of the local frequency response which may determine the sound distortion and the character of an acoustic null, but also the width associated with the extremum. As such, in some embodiments, it may not only be an extremum value of the sound pressure level which determines whether a frequency range is added to the list of exclusion frequencies. For example, a width associated with a minimum of the local frequency response may be taken into account. Alternatively, an integrated sound pressure level associated with a minimum of the local frequency response may be taken into account. This may be advantageous for an exclusion criterium to ensure an optimal selection of frequency ranges for the list of exclusion frequency ranges.

According to an embodiment of the invention said exclusion criterium comprises a frequency interval.

It may be preferable for the calibration method to only work in an interval of frequencies. There may for example be no reason to apply a calibration method at frequencies which are not audible to humans. Furthermore, there are intervals of frequencies which are typically more susceptible to interference effects. A restriction of the calibration method to a relevant interval of frequencies may significantly reduce the time needed to carry out the method as opposed to performing the method over an extended frequency interval, such as an interval from 20 Hz to 20 KHz.

According to embodiments of the invention, only frequency ranges that are contained in the frequency interval may be added to the list of exclusion frequency ranges.

According to an embodiment of the invention said frequency interval comprises frequencies in the range from 10 Hz to 500 Hz, such as in the range from 20 Hz to 200 Hz.

Typically, an acoustic environment mainly influences an interval of frequencies, i.e. interference effects such as acoustic nulls are most predominant in a certain frequency interval. Therefore, it may be advantageous to target this interval when applying the method of calibrating a loudspeaker system in order to reduce the time needed to carry out the method. The frequency interval may comprise the range of frequencies from 20 Hz to 20 kHz, such as from 20 Hz to 2 kHz, such as from 20 Hz to 200 Hz, for example from 20 Hz to 80 Hz, but is not limited to these examples.

According to an embodiment of the invention endpoints of said exclusion frequency ranges are based on zero crossings of said difference frequency response.

According to an embodiment of the invention endpoints of said filter frequency ranges are based on zero crossings of said difference frequency response.

In an embodiment of the invention, the calibration method identifies all frequency ranges between neighbouring zero crossings of the sound pressure level of the difference frequency response within the frequency interval. Here, the limits of the frequency interval may also be limits of the outermost frequency ranges. Each frequency range is sorted to be either a filter frequency range or an exclusion frequency range, such that any frequency range associated with a sound pressure level of the difference frequency response below a sound pressure level threshold, such as below −9 dB, is added to a list of exclusion frequency ranges, while the remaining frequency ranges are added to a list of filter frequency ranges.

According to an embodiment of the invention said target filter frequency is within a selected filter frequency range of said one or more filter frequency ranges and is a central frequency of a maximum or minimum of said difference frequency response within said selected filter frequency range.

After identifying one or more filter frequency ranges, a target filter frequency is chosen. The target filter frequency may be a frequency at which a calibration filter is to be implemented. In this sense, the target filter frequency may be a central frequency of the calibration filter, i.e. a frequency where the calibration filter has a greatest impact on the local frequency response.

In a preferred embodiment of the invention, the difference frequency response is analysed to locate the largest absolute sound level pressure within the filter frequency ranges, and the target filter frequency is the frequency of this largest absolute sound level pressure.

In other embodiments, a selected frequency interval is found based on an integration of the absolute sound pressure level of each filter frequency range. The frequency interval which provides the largest value from the integration may be the selected filter frequency range from which a target filter frequency is chosen. The target filter frequency may then be found as a maximum of the absolute sound pressure level, as an average frequency, as a weighted average frequency using sound pressure level as weight or obtained from a fit.

According to an embodiment of the invention said calibration filter is an infinite impulse response filter.

A calibration filter may be an infinite impulse response filter, preferably a digital biquad filter, but is not restricted to this example. Infinite impulse response filters are advantageous, since they may apply to a relatively narrow range of frequencies.

According to an embodiment of the invention said calibration filter is a biquad filter, such as a digital biquad filter.

A biquad filter, e.g. a digital biquad filter, may be characterized as a type of second-order infinite impulse response filter. In a frequency representation, its transfer function is a ratio of two quadratic functions.

According to an embodiment of the invention said calibration filter comprises a filter gain.

According to an embodiment of the invention said filter gain is based on a sound pressure level of said difference frequency response at said target filter frequency.

A filter gain may be understood as the change in sound pressure level that the filter exerts at a target filter frequency, or a range of frequencies in close proximity to the target filter frequency, and can be either positive or negative.

Within the calibration method of the invention, it is advantageous that the gain of a calibration filter may be chosen such that a filtered frequency response may approach target frequency response as accurately as possible.

According to embodiments of the invention, the filter gain may be chosen such that the sound level pressure of the filtered frequency response at the target filter frequency is as close as possible to the sound pressure level of the target frequency response at the same target filter frequency, such as identical or approximately the same sound pressure level.

According to an embodiment of the invention said calibration filter comprises a filter quality factor.

A filter quality factor, or Q-factor, is a factor relating to an equalizer. It is understood as the ratio of a center frequency to bandwidth, i.e. the ratio between the target filter frequency and a frequency width surrounding the target filter frequency. For a fixed target filter frequency bandwidth is inversely proportional to the Q-factor—meaning that as Q is raised, the bandwidth is narrowed. The quality factor is a useful tool of a parametric equalizer since it allows for attenuating or boosting a signal within a very narrow or wide range of frequencies within each equalizer band. Broad and narrow bandwidths (low and high Q, respectively) may be used in conjunction with one another to achieve the desired effect.

According to an embodiment of the invention said filter quality factor is selected based on a minimization of a difference between said target frequency response and said filtered frequency response.

According to an embodiment of the invention, said minimization is carried out by a searching algorithm.

The filter quality factor may be selected to minimize the difference between the target frequency response and the filtered frequency response. This selection may be performed by a fitting algorithm or a searching algorithm. For example, a list of possible filter quality factors is provided, and a binary search algorithm performs a search though this list, to find the filter quality factor which provides a minimal difference between the target frequency response and the filtered frequency response. As an example, a quality factor, or Q-value, providing a minimal difference between the target frequency response and the filtered frequency response at the target filter frequency may advantageously be found from a reduced range of Q-values. The difference between the target frequency response and filtered frequency response have shown to exhibit a certain dependency on the Q-value. Observations show that the difference exhibits a second-order type dependency on the Q-value and this dependency only exhibits a single extreme where the difference is smallest. This observation may specifically be accounted for by the searching algorithm when finding the best possible quality factor. The search algorithm may start with establishing the difference at a given starting Q-value and next establish the difference for neighbouring Q-values, i.e. both smaller and greater Q-values. From these Q-values it may be determined whether the minimum difference is obtained by a Q-value smaller or greater than the given starting Q-value. Thus, owing to the above-mentioned dependency, a great number of Q-values may be disregarded, and an optimal Q-value may be found faster than if all Q-values had to be evaluated. After determining that a more suitable Q-value resides at higher or lower values than the starting Q-value the searching algorithm may proceed with evaluating the difference at a Q-value which resides in the middle of an interval of Q-values starting from the starting Q-value and ending in an upper or lower limit of applicable Q-values of the equalizer. The search algorithm may perform this method in multiple steps in order to establish an optimal Q-value for the filter to be applied at the target filter frequency.

According to an embodiment of the invention said minimization is performed within a filter frequency range comprising said target filter frequency.

The minimization of a difference between the target frequency response and the filtered frequency response may be performed within the filter frequency range in which the target filter frequency range lies. In an embodiment of the invention, the difference between the target frequency response and the filtered frequency response is calculated, this difference is squared, and this squared difference is integrated within the frequency range comprising the target filter frequency. The filter quality factor is then selected to minimize this integrated squared sum.

According to an embodiment of the invention said method further comprises a step of selecting an auxiliary target filter frequency within a selected exclusion frequency range and wherein said auxiliary target filter frequency is a central frequency of a minima of said local frequency response within said selected exclusion frequency range, and wherein said method further comprises a step of implementing in said equalizer an auxiliary calibration filter related to said auxiliary target filter frequency.

Providing a full compensation for an acoustic null may be problematic, however, performing partial compensation may be advantageous. Therefore, in some embodiments of the invention, an auxiliary calibration filter may be implemented at an auxiliary target filter frequency which lies within an exclusion frequency range. The auxiliary calibration filter may be a filter which is a different type of filter than a calibration filter, in the sense that its gain may be restricted. For example, an auxiliary calibration filter may comprise an auxiliary filter gain, and the magnitude of this auxiliary filter gain may be restricted to e.g. 9 dB. The implementation of an auxiliary calibration filter is not be restricted to take place at any specific time during the steps of the calibration method. An auxiliary calibration filter may be implemented after implementation of a calibration filter, before implementation of a calibration filter, of between two implementations of calibration filters.

According to an embodiment of the invention said method further comprises a step of providing an input audio signal and filtering said input audio signal using said calibration filter to provide a filtered audio signal to be reproduced by said loudspeaker system.

When one or more filters have been implemented in the equalizer, the loudspeaker system may be considered calibrated to the acoustic environment with respect to a certain recording position. The loudspeaker system may then receive any input audio signal and apply any implemented filters to this input audio signal to provide a filtered audio signal which may be emitted into the acoustic environment by one or more loudspeakers of the loudspeaker system. The input audio signal may for example be any type of audio, e.g. music or audio synchronized to a motion picture, but is not restricted to these examples.

According to an embodiment of the invention one or more steps selected from the steps of applying an audio test signal, recording said audio test sound, providing a local frequency response, providing a target frequency response, establishing a difference frequency response, generating a list of exclusion frequency ranges, identifying one or more filter frequency ranges, selecting a target filter frequency and implementing a calibration filter are performed a plurality of times.

In some embodiments of the invention, the calibration method of the invention is an iterative calibration method, where one or more of the steps of the method are repeated one or more times, such as a plurality of times. In this context, an iteration may be understood as a repetition of one or more steps of the method, which may be based on input from a previous iteration. In an iterative calibration method according to these embodiments, the difference frequency response may be updated based on the implementation of a calibration filter, and based on the updated difference frequency response, an additional calibration filter may be implemented.

In some embodiments of the invention, the difference frequency response may be updated based on the filtered frequency response, e.g. the filtered frequency response is used as an updated difference frequency response. This difference frequency response may then serve as basis for an additional target filter frequency, where an additional calibration filter may be implemented in the equalizer.

In these embodiments, the list of exclusion frequency ranges and the filter frequency ranges may be updated based on the updated difference frequency response.

In other embodiments of the invention, the audio test signal is supplied to the equalizer to generate a filtered audio test signal, based on any implemented calibration filters in the equalizer. The filtered audio test signal may then be used by one or more loudspeakers of the loudspeaker system to generate a filtered audio test sound in the acoustic environment, which in turn may be recorded to provide a filtered recorded test signal used as basis for an updated local frequency response. Based on an updated local frequency response, an additional calibration filter may be implemented.

Iterations of the calibration method may be repeated any number of times, e.g. until a target frequency response criterium is met or a predefined number of times, for example 5 times or 20 times. A target frequency response criterium may be understood as a criterium which evaluates the filtered frequency response to determine if it resembles the target frequency response sufficiently, e.g. this evaluation could determine whether the sound pressure level difference between the filtered frequency response and the target frequency response within any filter frequency range exceeds 3 dB, and if the difference exceeds 3 dB an additional calibration filter may be implemented. A target frequency response criterium is not restricted to this example.

By utilizing an iterative calibration method wherein multiple iterations are executed, it is possible to reduce distortions in an acoustic environment to a higher degree than if only a single filter is implemented.

An aspect of the invention relates to a loudspeaker system comprising:

at least one loudspeaker, an audio amplifier, an equalizer, and an audio signal processor, wherein said loudspeaker system is arranged to carry out the method according to any of the preceding claims.

A loudspeaker system may be understood as a system comprising one or more loudspeakers and one or more loudspeaker driving units. According to an embodiment of the invention, the loudspeaker system is a single stand-alone device, such as an active loudspeaker. In another embodiment of the invention, the loudspeaker system is a distributed system comprising a plurality of electrically connected devices, such as two or more passive loudspeakers which are electrically connected to a loudspeaker driving unit, e.g. an amplifier. The equalizer may be an integral component of the amplifier or it may be a dedicated device.

According to embodiments of the inventions, the loudspeaker system may be arranged to facilitate a calibration method according to the method of the invention. This may require an equalizer, in which calibration filters may be implemented, such that any input audio signal provided to the loudspeaker system may be filtered by calibrations filters.

A loudspeaker system according to the invention should preferably comprise an audio signal processor. The audio signal processor may comprise the equalizer.

In some embodiments of the invention, audio amplifiers and equalizer are comprised in a loudspeaker system controller, which may also comprise an audio signal processor and means for receiving an input audio signal.

An audio signal processor may be an internal audio signal processor and it may be an external audio signal processor. An external audio signal processor may be understood as an audio signal processor which is integrated into an external device, and not into a loudspeaker system controller. An external audio signal processor may be characterized in that a loudspeaker system controller may receive, independently of the external audio signal processor, an input audio signal to be emitted as sound by one or more loudspeaker of the loudspeaker system. In contrary, an internal audio processor may be integrated in a loudspeaker system controller. Embodiments of the invention may comprise both an internal audio signal processor and an external audio signal processor.

An external audio signal processor may be in an external device, i.e. an electronic processing device, such as a smartphone, laptop computer or tablet. An external device may communicate with any other part of the loudspeaker system such as the equalizer or an internal audio signal processor through any connecting means. Examples of connecting means are wired connections such as a cabled connection and wireless connections such as a Bluetooth connection, e.g. Bluetooth A2DP or Bluetooth aptX, or a Wi-Fi connection.

The method according to the invention comprises steps of applying an audio test signal, recording an audio test sound, providing a local frequency response, providing a target frequency response, generating a list of exclusion frequency ranges, identifying filter frequency ranges, selecting a target filter frequency, and implementing a calibration filter. Any steps of the method of the invention may be performed on an internal audio signal processor and any steps of the method may be performed on an external audio signal processor.

For example, in some embodiments of the invention, an external audio signal processor may perform the step of recording an audio test sound, which is then provided to an internal audio signal processor arranged to perform other steps of the method. In other embodiments of the invention, an external audio signal processor may provide a local frequency response, provide a target frequency response, establish a difference frequency response, generate a list of exclusion frequency ranges, identify filter frequency ranges, and select a target filter frequency.

THE DRAWINGS

Figure 2A:
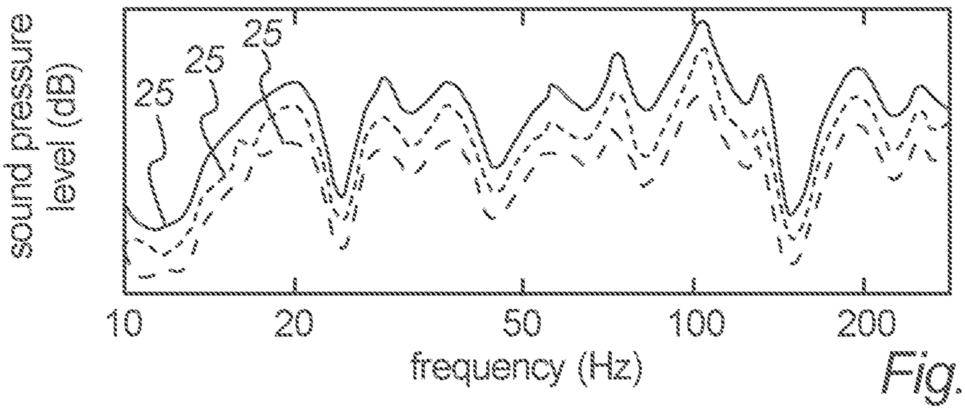
Figure 2B:
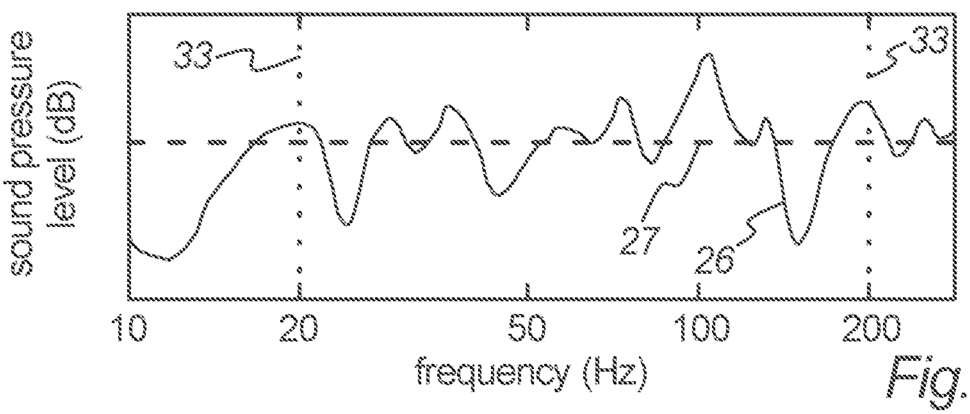
Figure 3A:
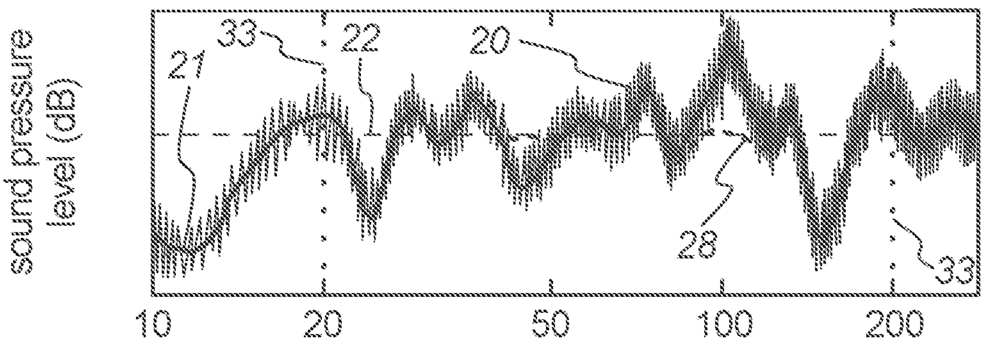
Figure 3B:
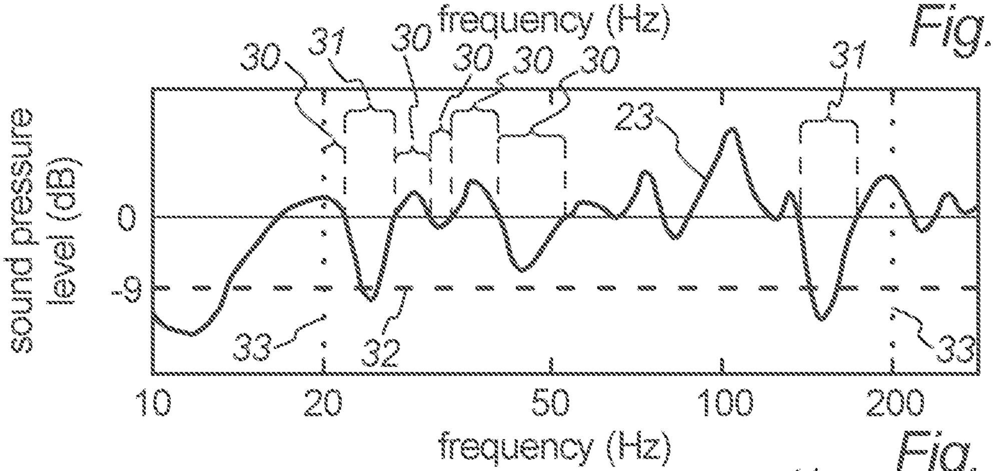
Figure 3C:
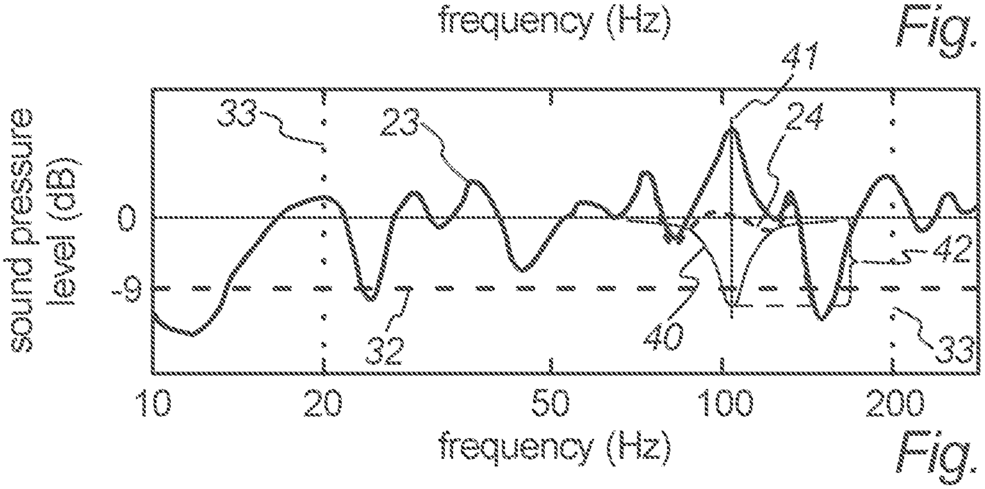
Figure 3D:
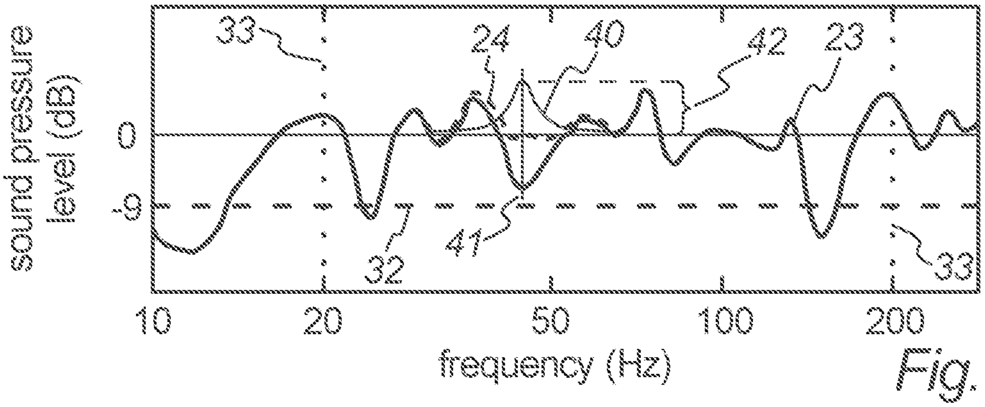
Figure 4:
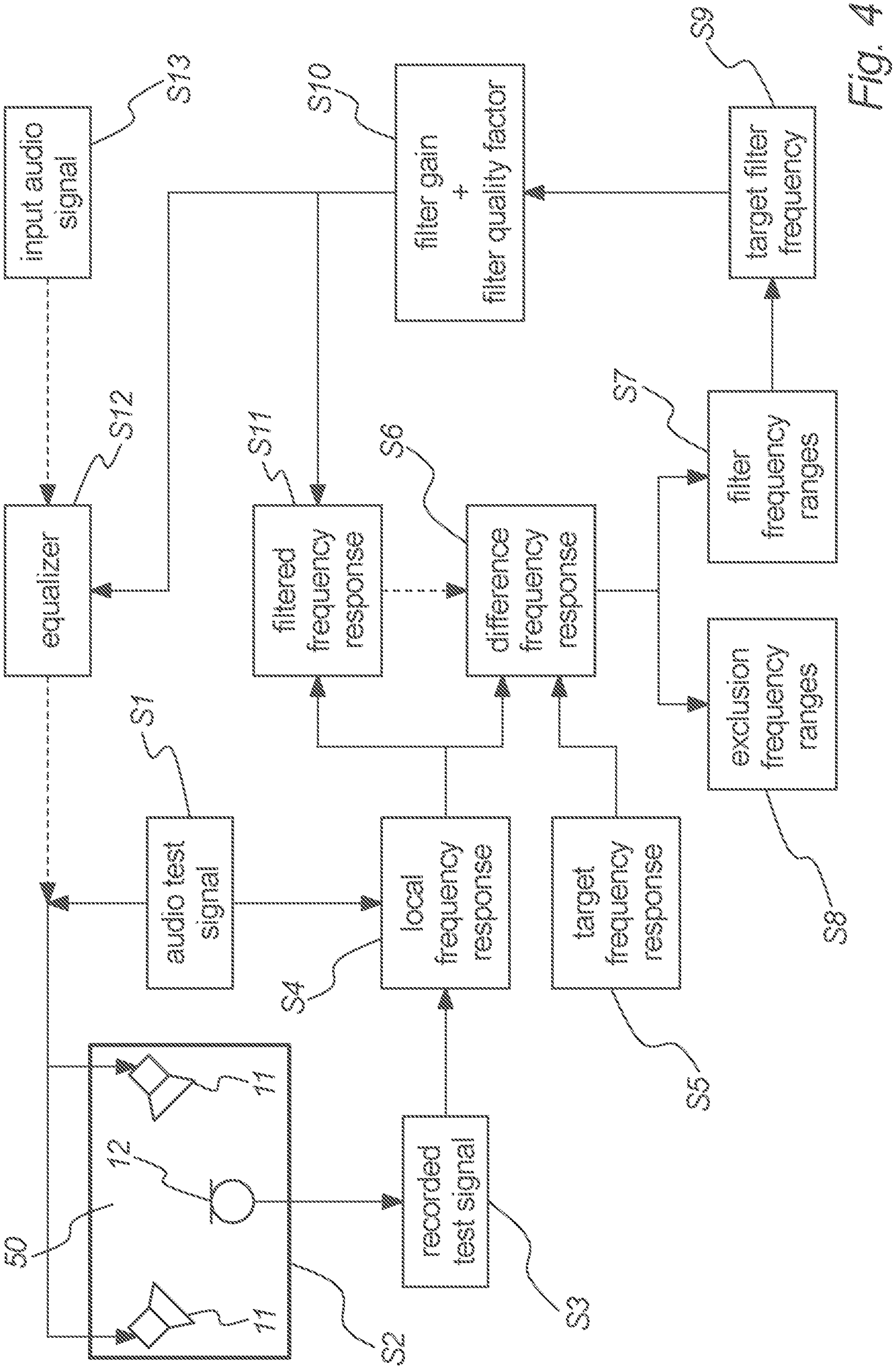
Figure 5A:
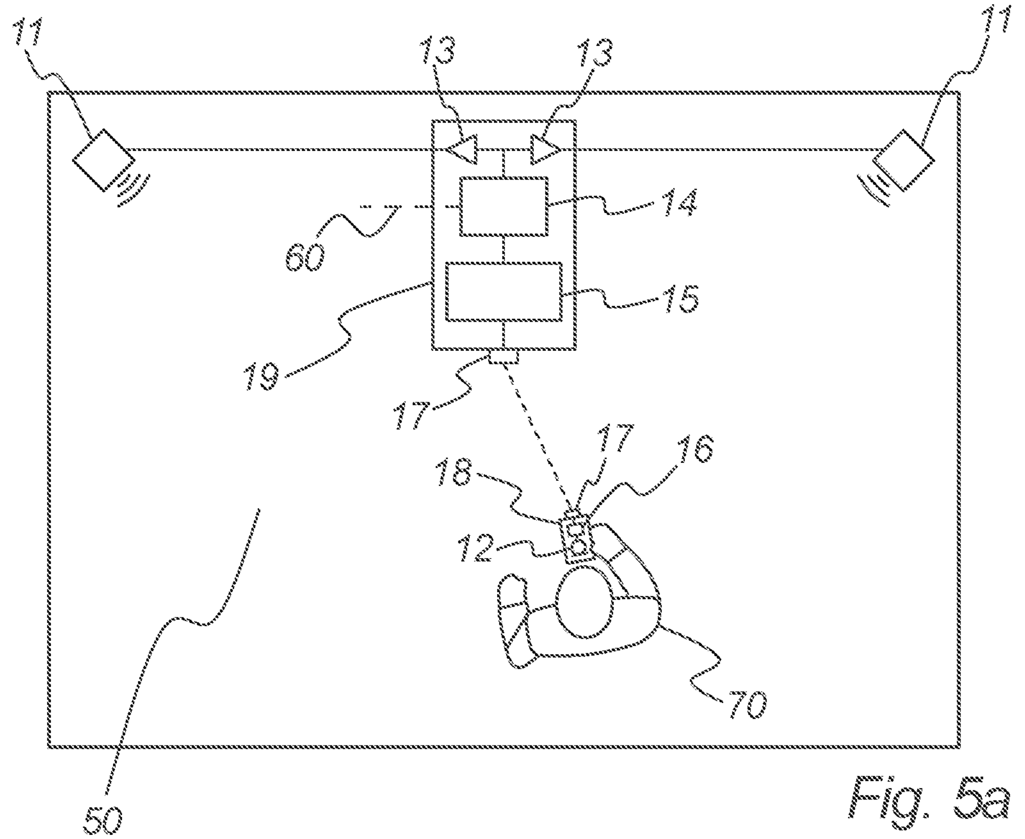
Figure 5B:
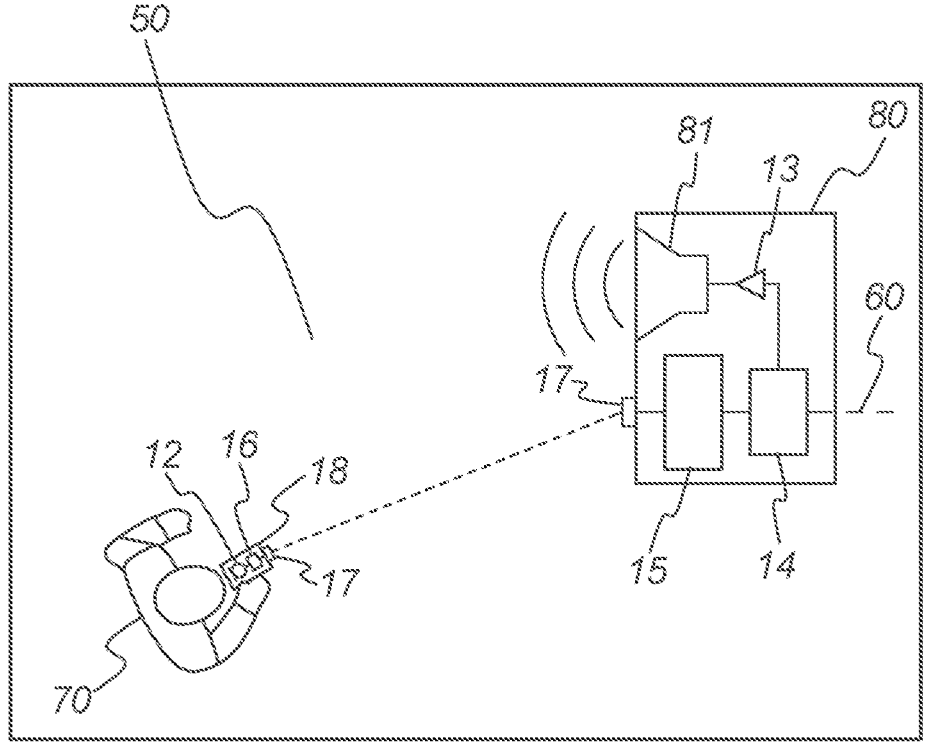

Various embodiments of the invention will in the following be described with reference to the drawings where FIG. 1 illustrates an acoustic environment in which a loudspeaker system may be calibrated according to an embodiment of the invention, FIGS. 2*a*-2*b* illustrate steps of providing a target frequency response according to an embodiment of the invention, FIGS. 3*a*-3*d* illustrate steps of implementing calibration filters based on analysis of frequency responses according to preferred embodiments of the invention, FIG. 4 illustrates a flowchart describing the calibration method according to embodiments of the invention, and FIGS. 5*a*-5*b* illustrate different configurations of a loudspeaker system according to embodiments of the invention.

DETAILED DESCRIPTION

FIG. 1 illustrates an acoustic environment 50, e.g. a room, in which loudspeakers 11 of a loudspeaker system are arranged to emit acoustic sound. Due to the configuration of the room, i.e. placement of walls, floor, ceiling and possible furniture, the sound emitted by the loudspeakers 11 may not be perceived, by a listener/user in the room, as intended. In other words, the acoustics of the room influences the perception of sound in the room, or put in other words, the frequency response of the room is greatly affected by the configuration of the room.

In the following detailed description is referred to a local frequency response and a target frequency response. The local frequency response is the frequency response of the loudspeaker system, as augmented/influenced by the configuration of the acoustic environment, and the target frequency response is a frequency response which is desired by the listener in the room. Steps of the method according to the invention comprise providing a local frequency response and a target frequency response, with the intention of implementing at least one calibration filter such that a filtered frequency response may approach the target frequency response, compared to the local frequency response. The listener may decide to calibrate the loudspeaker system such that the local frequency response at a listening position 52 becomes as close as possible to the intended target frequency response.

In the embodiment of the invention shown in FIG. 1 the target frequency response is based on recordings of an audio test sound, and these recordings are performed at different recording positions 51 within the acoustic environment. For example, a recording of an audio test sound is performed at each of the three shown recording positions 51 to provide three recorded test signals. Each recorded test signal may then be used to generate a recording position frequency response 25, such that three recording position frequency responses are provided in total. These three recording position frequency responses may then be average to provide a target frequency response, upon which a difference frequency response is based. In other embodiments of the invention, the three recorded test signals may be averaged, and a target frequency response may be generated based on the averaged recorded test signal. A local frequency response may then be generated based on a recording of an audio test sound at a listening position 52.

FIG. 2*a*-2*b* illustrate an embodiment of the invention in which a target frequency response is based on recordings of an audio test sound from three recording positions 51.

Each recording performed at a recording position 51 is used as a basis for providing a recording position frequency response. In FIG. 2*a*, three recording position frequency responses 25 are shown, and these are obtained from recordings performed at the three recording positions 51 as shown in FIG. 1, however the recording positions could be anywhere in the room, and in other embodiments of the invention the number of recordings is not restricted to 3 but may be any number of recordings. As shown in FIG. 2*a*, the recording position frequency responses 25 are different from each other which illustrate that the influence of the configuration of the acoustic environment 50 on the frequency response is different for different recording positions 51. The recording position frequency response 25 shows sound pressure level (in units of dB) as a function of frequency. In this embodiment, the frequencies of the recording position frequency responses 25 are in the range from 10 Hz to a little more than 200 Hz, however in other embodiments of the invention, the interval of frequencies may be any other interval.

FIG. 2*b* shows an average 26 of recording position frequency responses, which is an average of the three recording position frequency responses 25 as shown in FIG. 2*a*. In this embodiment of the invention, the target frequency response is chosen as a mean value of the average 26 of recording position frequency responses, and this mean 27 of recording position frequency responses is calculated within a lower and upper calibration method frequency limit 33, which in this embodiment is at 20 Hz and at 200 Hz, however in other embodiments of the invention, these limits 33 may take on other frequency values.

In other embodiments of the invention, an average of recording position frequency responses 26 may even be used directly as a target frequency response. Alternatively, in some embodiments, a mean of recording position frequency responses 27 may be used as basis for a target frequency response, where a mean may be understood as a mean across an interval of frequencies, such that the mean of recording position frequency responses 27 is constant as illustrated in FIG. 2*b*.

FIG. 3*a*-3*d* illustrate steps of implementing one or more calibration filters according to embodiments of the invention.

FIG. 3*a* shows a non-averaged local frequency response 20 which represents a frequency response as measured at the listening position 52. The measured non-averaged local frequency response 20 of this embodiment is smoothed to provide a local frequency response 21 which is seen as a smooth curve on the diagram of FIG. 3*a*.

For example, the local frequency response 21 is a running average of the non-averaged local frequency response 20, or the local frequency response 21 is obtained by applying a noise filter to the non-averaged frequency response 20. The frequency response diagram further shows a target frequency response 22, which is a desired frequency response. Lastly, the frequency response diagram also shows a filtered frequency response 28, which is obtained after implementing two calibration filters in an equalizer 14 (not shown in the figure) of the loudspeaker system. In the following section is described in detail how these two calibration filters are determined.

The aim of the calibration method is to implement one or more calibration filters, such that a filtered frequency response 28 may be as close as possible to the target frequency response 22 within calibration method frequency limits 33, while not compensating for acoustic nulls, which are characterized may be seen as large minima/dips in the local frequency response 21.

To carry out the method, a difference frequency response 23 is provided, based on a difference between the local frequency response 21 and the target frequency response 22. FIG. 3*b* shows a frequency response diagram including the difference frequency response 23. In this example, the difference frequency response 23 is obtained by subtracting the target frequency response 22 from the local frequency response 21. Next, within the calibration method frequency limits 33, a number of frequency ranges are identified, and in this embodiment of the invention, these are identified based on zero crossings of the difference frequency response 23, i.e. based on frequencies where the difference frequency response 23 is at 0 dB. In other embodiments of the invention the frequency ranges are identified in different ways.

The frequency ranges comprise exclusion frequency ranges 31 which are associated with large dips/minima in the difference frequency response 23. These large dips represent acoustic nulls which arise due to destructive interferences of sound emitted by loudspeakers 11 of the loudspeaker system. The exclusion frequency ranges are selected based on an exclusion criterion. In this embodiment the exclusion criterium is a criterium based on a sound pressure level threshold 32, which is-9 dB, but in other embodiments of the invention other exclusion criterium may be used. When a dip in the sound pressure level of the difference frequency response 23 is below-9 dB the corresponding frequency ranges 31 are added to a list of exclusion frequency ranges. This list of exclusion frequency ranges dictate which frequency ranges does not need to be compensated, i.e. where no calibration filter should be implemented. The frequency ranges further comprise filter frequency ranges 30 which are frequency ranges pertaining to maxima and minima in the difference frequency response 23, however these does not pertain to the greatest minima, i.e. the excluded frequency ranges 31. In this embodiment of the invention the exclusion filter frequency ranges 31 and the filter frequency ranges 30 are shown as non-overlapping or non-intersecting.

FIG. 3*c* shows a next step of the method in which a target filter frequency 41 is selected. The diagram is based on the same diagram as shown in FIG. 2*b*. The target filter frequency 41 is selected based on the greatest absolute sound level pressure of the difference frequency response 23 within the calibration method frequency limits 33. As seen, this target filter frequency does not belong to an exclusion filter frequency range 31 as identified in FIG. 3*b*. The target filter frequency sets a central frequency for a calibration filter 40 to be implemented—in this example the filter to be implemented is a digital biquad filter. Typically, such a calibration filter is characterized by a central filter frequency, or target filter frequency 41, a filter gain, and a filter quality factor. The target filter frequency 41 is used as the frequency at which a calibration filter is to be implemented.

The effect of the calibration filter 40 is to reduce the difference frequency response 23 at the target filter frequency 41 as much as possible, i.e. to ensure that the difference frequency response 23 is as close as possible to 0 dB. The calibration filter 40 is characterized by a filter gain 42, which in this embodiment of the invention is set at a magnitude which is equivalent to the magnitude of the maxima to be filtered. Notice that the filter gain 42 is opposite to the magnitude of the maxima in the difference frequency response 23 to be corrected. The calibration filter 40 is further characterized by comprising a quality factor, which is a ratio of the filter gain 42 to a bandwidth of the filter. In this embodiment, a calibration filter 40 having a high quality factor corresponds to a narrow filter in frequency, and a calibration filter having a low quality factor corresponds to a wide filter in frequency. The filter gain 42 and filter quality factor are chosen to minimize a difference between the filtered frequency response 24 and the target frequency response 22.

FIG. 3*c* shows the effect of implementing the calibration filter 40 at the target filter frequency 41. A filtered difference frequency response 24 is shown as the result of implementing the calibration filter 40. The figure shows that the filter has actually reduced the difference frequency response 23 locally at the target filter frequency 41 and at frequencies in close proximity to the target filter frequency 41.

The calibration method thus finds a preferable filter gain 42 and filter quality factor, based on a minimization procedure which seek towards a minimum in the difference between a resulting filtered frequency response and the target frequency response, and implement a corresponding calibration filter 40 in an equalizer of the loudspeaker system. A frequency representation of the implemented calibration filter 40 is shown in the figure. By subtracting the frequency representation of the calibration filter 40 from the difference frequency response 23, a difference frequency response based on a filtered frequency response 24 is obtained, which lies closer to a sound pressure level of zero in the vicinity of the target filter frequency.

In a preferred embodiment of the invention, at least one additional calibration filter 40 is implemented. In FIG. 3*d* is shown how such an additional calibration filter 40 is implemented at a new target filter frequency 41 slightly below 50 Hz. Since this target filter frequency 41 is associated with a filter frequency range 30 associated with a minimum of the difference frequency response 23, and that minimum has a sound pressure level which is not below the sound pressure level threshold 32, i.e. it is not associated with an exclusion frequency range, a calibration filter 40 may be applied.

The calibration filter 40 of FIG. 3*d* is determined in a similar fashion as the calibration filter shown in FIG. 3*c*, however this calibration filter 40 uses a smaller filter gain 42 since the minimum in the difference frequency response 23 to be corrected has a smaller amplitude than the amplitude of the maximum which was compensated with the previous calibration filter. Furthermore, the filter is arranged with a positive gain since the peak to be corrected is a minimum, and not a maximum as for the previous filter.

After the two calibration filters 40 are implemented, a filtered frequency response 28 is obtained (see FIG. 3*a*). As seen on FIG. 3*a* the filtered frequency response 28 is closer to the target frequency response 22 than the local frequency response 21 at the target filter frequencies used for the two calibration filters. In other embodiments of the invention, additional calibration filters are implemented such that the filtered frequency response 28 may get even closer to the target frequency response 22.

In other embodiments of the invention where a plurality of calibration filters 40 are implemented in the equalizer of the loudspeaker system, a filtered frequency response 28 obtained after implementation after a first calibration filter 40, may be used as a new local frequency response, and from this new local frequency response, a new difference frequency response is calculated by subtraction with the same target frequency response. The newly obtained difference frequency response is then analyzed in a similar way as described above, a new calibration filter is implemented in the equalizer and a new filtered frequency response is obtained. The method may thus be seen as a recursive method where a filtered frequency response is used as input (as a local frequency response) and an improved filtered frequency response which is closer to the target filter frequency response is obtained.

FIG. 4 illustrates a flowchart which describes a calibration method according to embodiments of the invention.

Initially, an audio test signal S1 is provided to loudspeakers 11 of the loudspeaker system which is present in an acoustic environment 50. As a next step S2, the loudspeakers 11 emits a corresponding audio test sound which is recorded by a microphone 12 of an electronic processing device to provide a recorded test signal (Step S3). The electronic processing device in this embodiment may be a smartphone, however other electronic processing devices such as tablets, or computers such as laptop computers may be used in other embodiments of the invention. Based on the audio test signal (Step S1) and the recorded test signal (Step S3), a local frequency response S4 is provided. Additionally, a target frequency response is provided in a step S5. The target frequency response in this example is based on additional recordings of the audio test sound performed at various recording positions 51 within the acoustic environment 50. In other embodiments of the invention, the target frequency response 22 is provided on the basis of an auxiliary audio test sound, which may be a sound emitted by one or more loudspeakers 11 and which is different from the audio test sound. In yet other embodiments of the invention, the target frequency response 22 is provided on the basis of the local frequency response 21 and/or a pre-programmed frequency response.

Next, in a step S6 a difference frequency response 23 is established based on a difference between the local frequency response 21 provided in step S4 and the target frequency response 22 provided in step S5. Based on the difference frequency response 23, filter frequency ranges 30 are identified in a step S7 and exclusion frequency ranges 31 are identified in a step S8.

Next, in a step S9, a target filter frequency 41 is selected within one of the identified filter frequency ranges 30. Next in a step S10, a calibration filter 40 is configured at the target filter frequency 41. The step of configuring the calibration filter 40 comprises choosing an appropriate filter gain 42 and quality factor such that the calibration filter may provide for a filtered frequency response 28 which is closest to the target frequency response 22 at the target filter frequency 41. This step of configuring the calibration filter 40 by choosing an appropriate quality factor is performed based on a minimization procedure which seeks after the quality factor for which the difference between the resulting filtered frequency response 28 and the target frequency response 22 is minimized as much as possible. The minimization procedure is carried out by a search algorithm which seeks after an optimal quality factor, or Q-value. In this example, the calibration filter 40 is based on a digital biquad filter. Thus, in step S11 a filtered frequency response is provided on the basis of the configured calibration filter 40.

Next, the configured calibration filter 40 is implemented in an equalizer of the loudspeaker system in a step S12.

Some embodiments of the invention are based on iterations of some of the previously mentioned steps, and these embodiments concern implementation of a plurality of calibration filters 40. In some of these embodiments, after a filtered frequency response has been be provided (step S11), the difference frequency response S6 is updated by basing the difference frequency response which was provided in step S6 on a difference between the target frequency response provided in step S5 and the filtered frequency response provided in step S11, instead of on a difference between the target frequency response provided in step S5 and the local frequency response provided in step S4. Based on this, a new set of filter parameters may be found, an additional calibration filter may be implemented in the equalizer in, and the filtered frequency response may be updated. This procedure may be repeated iteratively any number of times.

When one or more calibration filters have been implemented in the equalizer, the loudspeaker system is ready to receive an input audio signal 60 in a step S13, which is filtered according to the one or more calibration filters 40 implemented in the equalizer of the loudspeaker system to provide a filtered audio signal which is emitted as sound by one or more loudspeakers 11. Thereby is obtained a reproduction of an input audio signal 60, which reproduction takes into account the acoustics of the acoustic environment 50 without overdriving any loudspeakers 11 to compensate for acoustic nulls in the acoustic environment 50.

FIG. 5*a-b* illustrate embodiments of the invention in which a user 70 of the loudspeaker system may use an electronic processing device, for example a smartphone device 18, to control the calibration method as described in detail above.

As seen in FIG. 5*a*, the loudspeaker system comprises a loudspeaker system controller 19 which comprises amplifiers 13, an equalizer 14, and an internal audio signal processor 15. The loudspeaker controller 19 is arranged to receive an input audio signal 60 to be filtered in the equalizer 14, amplified in the amplifiers 13, and emitted by the loudspeakers 11.

In this embodiment of the invention, the calibration method of the invention is controlled by a user 70 using a smartphone device 18. The user 70 of the loudspeaker system initializes the calibration method by using a smartphone device 18, e.g. by pressing on a button a screen of the smartphone device 18. The instruction of initializing the calibration method may is received by a communication interface 17 of the loudspeaker system controller 19 which enables for wireless communication with the smartphone device 18. The smartphone device 18 may prompt the user 70 to position himself/herself at one or more recording positions 51 (not shown) within the acoustic environment 50, in order to establish a target frequency response 22, by obtaining one or more recording position frequency responses 25 through recordings of an audio test sound using the microphone 12 of the smartphone device 18.

The smartphone device 18 then prompts the user 70 to position him/her at a listening position 52 which is representative of a position where the user is typically positioned when listening to sound, e.g. music, from the loudspeaker system. Based on a recording, by the smartphone device 18, of an audio test signal, a local frequency response 21 is generated and the method proceeds with implementing a calibration filter 40 into the equalizer 14 of the loudspeaker system as detailed above.

In other embodiments of the invention, the audio test signal, or auxiliary audio test signal, used for obtaining recording position frequency responses 25 for obtaining a target frequency response 22 is different from the audio test sound used in order to obtain the local frequency response 21.

In other embodiments of the invention, the target frequency response is provided in a different manner, such as also on the basis of a pre-programmed frequency response which the user 70 may select on the smartphone device 18. For example, the user may choose, on the smartphone device, a pre-programmed frequency response suited to a certain type of music, and this pre-programmed frequency response may then be adapted to a target frequency response on the basis of recordings According to this embodiment of the invention, the smartphone device 18 comprises an external audio signal processor 16 (external from the loudspeaker system) arranged to perform processing of audio recorded by the microphone 12. The steps of the method, as described above, may be carried out in any manner among the external audio signal processor 16 and the internal audio signal processor 15. In embodiments utilizing several processors as shown in FIG. 5*a*, the processors are communicatively associated, e.g. both the smartphone device 18 and the loudspeaker system controller 19 comprises a communication interface 17 enabling for wireless communication between the devices.

The method step establishing a difference frequency response 21 may in some embodiments be performed using the smartphone device 18, and in some other embodiments be performed using the loudspeaker system controller 19.

FIG. 5*b* shows another embodiment of the invention, wherein the loudspeaker system comprises a single active loudspeaker 80. The active loudspeaker 80 comprises an audio amplifier 13, an equalizer 14, an internal audio signal processor 15, and a transducer unit 81 which is the component of the active loudspeaker that converts an audio signal into acoustic sound by the use of e.g. a loudspeaker diaphragm actuated by a voice coil. It furthermore comprises a communication interface 17, which enables communication with an electronic processing device, e.g. a smartphone device 18, controlled by a user 70 of the loudspeaker system. The active loudspeaker may thus function in a similar way as the loudspeaker system described in the embodiment of FIG. 5*a*, and the method of implementing calibration filters 40 in the equalizer 14 is identical.

In the embodiment shown in FIG. 5*b*, the steps of the method of the invention may be distributed in any manner among an external audio signal processor 16 of the smartphone device 18 and an internal audio signal processor 15 of the active loudspeaker 80. For example, the calibration may be initialized by the user, and the audio test sound may be recorded by a microphone 12 of the smartphone device 18 to produce a recorded test signal, which is communicated to the internal audio signal processor 15 of the active loudspeaker 80, in which the remaining steps of the method are performed to finally implement at least one calibration filter in the equalizer 14.

In some iterative embodiments of the invention, an audio test signal is applied to the loudspeaker system before each implementation of a calibration filter.

LIST OF REFERENCE SIGNS

11 Loudspeaker
12 Microphone
13 Audio amplifier
14 Equalizer
15 Internal audio signal processor
16 External audio signal processor
17 Communication interface
18 Smartphone device
19 Loudspeaker system controller
20 Non-averaged local frequency response
21 Local frequency response
22 Target frequency response
23 Difference frequency response
24 Filtered difference frequency response
25 Recording position frequency response
26 Average of recording position frequency responses
27 Mean of recording position frequency responses
28 Filtered frequency response
30 Filter frequency range
31 Exclusion frequency range
32 Sound pressure level threshold
33 Calibration method frequency limit
40 Calibration filter
41 Target filter frequency
42 Filter gain amplitude
50 Acoustic environment
51 Recording position
52 Listening position
60 Input audio signal
70 User
80 Active loudspeaker
81 Transducer unit
S1-S13 Calibration method flowchart steps

The invention claimed is:

1. A method for calibrating a loudspeaker system in an acoustic environment; wherein said loudspeaker system comprises at least one loudspeaker, an audio amplifier, an equalizer, and an audio signal processor; wherein the method comprises the steps of:

applying an audio test signal to said loudspeaker system to generate an audio test sound in said acoustic environment, recording said audio test sound at a listening position in said acoustic environment to obtain a recorded test signal, and providing a local frequency response based on said recorded test signal;

providing a target frequency response for said at least one loudspeaker in said acoustic environment;

establishing a difference frequency response based on a difference between said target frequency response and said local frequency response;

generating on the basis of an exclusion criterium a list of exclusion frequency ranges associated with minima of said local frequency response;

identifying one or more filter frequency ranges associated with minima and/or maxima of said difference frequency response, wherein said filter frequency ranges are non-overlapping with said exclusion frequency ranges;

selecting a target filter frequency selected from said identified filter frequency ranges; and implementing in said equalizer a calibration filter related to said target filter frequency to provide a filtered frequency response, wherein said calibration filter is arranged to reduce a difference between said filtered frequency response and said target frequency response.

2. The method according to claim 1, wherein said step of recording said audio test sound at a listening position in said acoustic environment comprises recording said audio test sound using an electronic processing device (18) comprising a microphone.

3. The method according to claim 1, wherein said target frequency response is based on a predetermined frequency response.

4. The method according to claim 1, wherein said target frequency response is defined by a user of said loudspeaker system.

5. The method according to claim 1, wherein said target frequency response is based on a recording of an auxiliary audio test sound.

6. The method according to claim 5, wherein said recording of an auxiliary audio test sound is a proximity measurement.

7. The method according to claim 5, wherein said target frequency response is based on a plurality of recordings of said auxiliary audio test sound.

8. The method according to claim 5, wherein said auxiliary audio test sound is said audio test sound.

9. The method according to claim 1, wherein said exclusion criterium comprises a sound pressure level threshold.

10. The method according to claim 9, wherein a frequency range associated with a minimum of said local frequency response is assigned to said list of exclusion frequency ranges when an absolute value of a sound pressure level of said difference frequency response exceeds said sound pressure level threshold within said frequency range.

11. The method according to claim 10, wherein said sound pressure level threshold is a threshold value in the range from 2 dB to 20 dB.

12. The method according to claim 1, wherein a frequency range associated with a minimum of said local frequency response is assigned to said list of exclusion frequency ranges when a frequency width associated with said minimum exceeds a frequency width threshold.

13. The method according to claim 1, wherein a frequency range associated with a minimum of said local frequency response is assigned to said list of exclusion frequency ranges when an integrated sounds pressure level associated with said minimum exceeds an integrated sounds pressure level threshold.

14. The method according to claim 1, wherein said exclusion criterium comprises a frequency interval.

15. The method according to claim 14, wherein said frequency interval comprises frequencies in the range from 10 Hz to 500 Hz.

16. The method according to claim 1, wherein endpoints of said exclusion frequency ranges are based on zero crossings of said difference frequency response.

17. The method according to claim 1, wherein endpoints of said filter frequency ranges are based on zero crossings of said difference frequency response.

18. The method according to claim 1, wherein said target filter frequency is within a selected filter frequency range of said one or more filter frequency ranges and is a central frequency of a maximum or minimum of said difference frequency response within said selected filter frequency range.

19. The method according to claim 1, wherein said calibration filter is an infinite impulse response filter.

20. The method according to claim 1, wherein said calibration filter is a biquad filter.

21. The method according to claim 1, wherein said calibration filter comprises a filter gain.

22. The method according to claim 21, wherein said filter gain is based on a sound pressure level of said difference frequency response at said target filter frequency.

23. The method according to claim 1, wherein said calibration filter comprises a filter quality factor.

24. The method according to claim 1, wherein said filter quality factor is selected based on a minimization of a difference between said target frequency response and said filtered frequency response.

25. The method according to claim 24, wherein said minimization is performed within a filter frequency range (30) comprising said target filter frequency.

26. The method according to claim 25, wherein said minimization is carried out by a searching algorithm.

27. The method according to claim 1, wherein said method further comprises a step of selecting an auxiliary target filter frequency within a selected exclusion frequency range and wherein said auxiliary target filter frequency is a central frequency of a minima of said local frequency response within said selected exclusion frequency range, and wherein said method further comprises a step of implementing in said equalizer an auxiliary calibration filter related to said auxiliary target filter frequency.

28. The method according to claim 1, wherein said method further comprises a step of providing an input audio signal and filtering said input audio signal using said calibration filter to provide a filtered audio signal to be reproduced by said loudspeaker system.

29. The method according to claim 1, wherein one or more steps selected from the steps of applying an audio test signal, recording said audio test sound, providing a local frequency response, providing a target frequency response, establishing a difference frequency response, generating a list of exclusion frequency ranges, identifying one or more filter frequency ranges, selecting a target filter frequency and implementing a calibration filter are performed a plurality of times.

30. A loudspeaker system comprising:

at least one loudspeaker, an audio amplifier, an equalizer, and an audio signal processor, wherein said loudspeaker system is arranged to carry out the method according to claim 1.

* * * * *